United States Patent
Vaartstra

(12) 
(10) Patent No.: US 6,207,630 B1
(45) Date of Patent: Mar. 27, 2001

(54) PROCESSING COMPOSITIONS AND METHODS OF USING SAME

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/478,385

(22) Filed: Jan. 6, 2000

Related U.S. Application Data

(62) Division of application No. 08/914,509, filed on Aug. 19, 1997.

(51) Int. Cl.$^7$ .............................. H01L 21/302; C11D 7/50
(52) U.S. Cl. ..................... 510/175; 438/633; 438/692
(58) Field of Search ...................... 510/175, 176, 510/177, 178; 361/504, 506; 540/217; 252/62.2; 564/291, 457; 544/212; 504/137, 185; 568/347; 526/194; 438/633, 692; 134/3, 26, 61

(56) References Cited

U.S. PATENT DOCUMENTS

| | | |
|---|---|---|
| 2,857,331 | 10/1958 | Hollingsworth et al. . |
| 3,816,533 * | 6/1974 | Brandstrom et al. ............. 260/567.6 |
| 3,833,572 * | 9/1974 | Clark et al. ......................... 260/243 |
| 4,544,446 | 10/1985 | Cady . |
| 4,762,632 * | 8/1988 | Shinozaki et al. .................. 252/62.2 |
| 6,030,491 * | 2/2000 | Vaartstra ............................ 156/625.1 |

OTHER PUBLICATIONS

Akiya et al., "Thin–Oxide Dielectric Strength Improvement by Adding a Phosphonic Acid Chelating Agent into $NH_4OH$–$H_2O_2$ Solution," *J. Electrochem. Soc.,* 141, 4 pgs. (1994).

Cady et al., "RCA Clean Replacement," *J. Electrochem. Soc.,* 143, pp. 2064–2067 (1996).

Hidber et al., "Citric—A Dispersant for Aqueous Alumina Suspensions," *J. Am. Ceram. Soc.,* 79, 1857–1867 (1996).

* cited by examiner

*Primary Examiner*—Yogendra Gupta
*Assistant Examiner*—Gregory E. Webb
(74) *Attorney, Agent, or Firm*—Mueting, Raasch & Gebhardt, P.A.

(57) ABSTRACT

Compositions and methods for processing (e.g., cleaning) substrates, such as semiconductor-based substrates, as well as processing equipment, include one or more compounds of Formula (I):

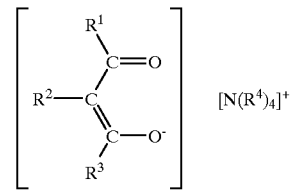

wherein each $R^1$, $R^2$, $R^3$, and $R^4$ is independently H or an organic group.

20 Claims, 2 Drawing Sheets

Preparation of a processing composition → Planarization of a wafer using the processing composition and an abrasive pad Planarization Using a Processing Composition Planarization Using a Processing Composition Post-Planarization Wafer Cleaning Post-Planarization Processing
Equipment Clean Planarization Using a Processing Composition
Containing an Abrasive Component

PROCESSING COMPOSITIONS AND METHODS OF USING SAME

This is a division of application Ser. No. 08/914,509, filed Aug. 19, 1997, (allowed), which is incorporated herein by reference.

FIELD OF THE INVENTION

The present invention pertains to compositions and methods for using such compositions in the removal of contaminants from substrates and equipment, particularly in the semiconductor fabrication industry. More particularly, the present invention is directed to the use of β-diketonate-containing compounds in processing (e.g., planarizing, polishing, cleaning) compositions and methods.

BACKGROUND OF THE INVENTION

A large fraction of yield losses in wafer fabrication or processing of semiconductor devices is attributed to contamination. Contaminants can be organic or inorganic particles, films or molecular compounds, ionic materials, or atomic species. Particularly problematic, however, is contamination from abrasive particles used during processing, such as planarization. For example, during chemical mechanical planarization or polishing (CMP), a rotating substrate of semiconductor material is held against a wetted planarization or polishing surface using a liquid slurry under controlled pressure and temperature conditions. The liquid typically consists of an abrasive component, such as alumina, silica, or similar particulates, although, alternatively, a pad could include the abrasive component. Once the planarization or polishing is complete, abrasive particles typically remain on the surface of the substrate.

Thus, the primary contaminants that need to be removed from the substrate surface during/after processing, such as planarization or polishing, and prior to subsequent processing steps are alumina, silica, and oxides. Other contaminants that can also be problematic include ionic, atomic, or molecular species containing sodium, potassium, lithium, calcium, boron, manganese, sodium, titanium, zirconium, magnesium, iron, copper, nickel, gold, silicon, and aluminum. Such contaminants may diffuse into the surface of the substrate and down fracture paths.

Also, the presence of contaminants during substrate processing has become particularly problematic in high density, large scale integration (LSI) technology. For example, contaminants can cause a device to fail by improperly defining features within the integrated circuit, creating unpredictable surface topography, inducing leakage currents through insulating layers, or accelerating device wearout.

SC-1 wet cleaning solutions (mixtures of $NH_4OH$, $H_2O_2$, and $H_2O$ in a volume ratio of 1:1:5 typically) used in an "RCA clean" are commonly used to clean wafer surfaces during processing. "RCA clean" has been the primary cleaning process for the semiconductor industry for nearly 30 years. RCA cleans reportedly remove particles and organic contaminants on semiconductor surfaces without significantly attacking the semiconductor surface. RCA cleans commonly include a series of two baths (with a third optional bath) for immersion of the wafers. The first bath typically contains the basic SC-1 wet cleaning solution. The second bath is optional and typically contains hydrofluoric acid (HF) or buffered HF for removal of oxides formed from the $H_2O_2$ in the SC-1 wet cleaning solution. Finally, the third bath is called an SC-2 wet cleaning solution, typically containing an acidic halogen solution (e.g., HCl along with $H_2O_2$ and $H_2O$ in a volume ratio of 1:1:6 typically) for removing heavy alkali ions and cations from the wafer surface. After immersion in each bath, the wafer surfaces are commonly rinsed in deionized water and optionally dried.

One problem associated with using such wet cleaning solution baths is that the chemicals need to be replenished frequently due to their reaction with particulates on the wafer surfaces and evaporation into the atmosphere. This is both costly and time-consuming. Recently, tetramethylammonium hydroxide (TMAH) has been utilized in wet cleaning solutions. TMAH has been shown to reduce chemical consumption, and, thus, lengthen the bath life. TMAH is reported to lengthen the bath life because it is not as readily evaporated from a standard wet cleaning solution as is ammonia in an SC-1 wet cleaning solution.

It has also been reported that phosphonic acid chelating agents added to an SC-1 wet cleaning solution reduce certain metallic contamination deposition on a silicon substrate. This conclusion was reached in the article entitled "Thin-Oxide Dielectric Strength Improvement by Adding a Phosphonic Acid Chelating Agent into $NH_4OH$—$H_2O_2$ Solution" by Akiya et al., *J.Electrochem. Soc.*, Vol. 141, No. 10, October 1994.

Also, it has been demonstrated that water soluble multidentate chelating agents, particularly water soluble bidentate ionic chelating agents, such as 1,2-ethylenediphosphonic acid (EDP), can be used during planarization processing to remove metal ion contaminants, as disclosed in U.S. patent application Ser. No. 08/682,308, filed on Jul. 17, 1996, entitled "A Planarization Fluid Composition Including Chelating Agents and Planarization Method Using Same."

The JTB-100 wet cleaning solution in a "Baker Clean" has also been used as a replacement for the RCA clean, as described by Cady et al. in "RCA Clean Replacement," *J. Electrochem. Soc.*, Vol. 143, No. 6 (June 1996). In this wet cleaning solution, TMAH-based alkaline material has been used in conjunction with a carboxylate buffer to remove particulate contaminants from wafer surfaces. This cleaning solution was sprayed on wafer surfaces, followed by a rinse in deionized water. The JTB-100 wet cleaning solution replaced the SC-1 and SC-2 wet cleaning solution baths in a conventional RCA clean. An optional bath containing a solution of $H_2SO_4/H_2O_2/H_2O$ in a volumetric ratio of 4:0.2:0.8 and an optional bath containing HF or buffered HF were used prior to the JTB-100 wet cleaning solution.

Another problem that has not been adequately addressed is the cleaning of the planarization or polishing surface both during and after processing. When planarization or polishing surfaces are used with abrasive slurries, it is important to prevent the buildup of abrasive particulates and other contaminants on such polishing surfaces. When abrasive pads are used, it is important to prevent the buildup of metal and metalloid ions and oxides, for example, on such abrasive pads. Such contaminants shorten the effective lifetime of processing equipment and should be removed to ensure precise processing of substrates during planarization or polishing without excessive contamination of the substrates.

Thus, compositions and methods are still needed to reduce, for example, the amount of metal and metalloid ion and abrasive particulate contamination of, for example, the substrate being processed and the processing equipment used. The present invention as described below provides such compositions and methods.

SUMMARY OF THE INVENTION

The present invention provides compositions and methods for processing substrate surfaces and equipment during planarizing, polishing, or cleaning processes, for example. The substrate surface can be a semiconductor-based substrate surface, among many other possibilities. Thus, the compositions of the present invention can be used at various places in processing a semiconductor-based substrate, for example, such as before, during, or after, planarization. The compositions include one or more β-diketonate-containing compounds of the following formula (Formula I):

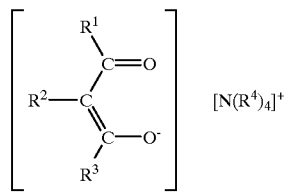

wherein each $R^1$, $R^2$, $R^3$, and $R^4$ is independently H or an organic group. Preferably, each $R^1$, $R^2$, $R^3$, and $R^4$ is independently H, or a hydrocarbyl group, optionally containing one or more heteroatoms (e.g., oxygen or nitrogen), fluorine atoms, or functional groups (e.g., a carbonyl group, a hydroxycarbyl group, or an aminocarbyl group).

The present invention also provides a method of processing a substrate surface. This method includes processing the substrate surface with a processing composition comprising a β-diketonate containing compound of Formula I. When processing a substrate surface using planarization or polishing, the processing composition can also include an abrasive component, such as silica or alumina, or an abrasive planarization or polishing surface can be used instead of, or in combination with, an abrasive processing composition.

As used herein, the term "processing" also includes cleaning. Thus, a preferred method of processing a substrate surface involves cleaning the substrate surface. In one embodiment of the present invention, a method of processing a semiconductor-based substrate surface is provided which includes the steps of planarizing the substrate surface, and cleaning the planarized substrate surface with a composition comprising a compound of the Formula I.

The present invention also provides a method of cleaning processing equipment, such as planarization processing equipment. The method comprises cleaning the processing equipment with a composition comprising a compound of Formula I. In one embodiment, the method includes providing a planarization surface, such as an abrasive pad or a polishing pad, and cleaning the planarization surface with a composition comprising a compound of Formula 1. This cleaning process can be done during or after planarizing a substrate surface with an abrasive component.

Also provided is a processing composition for use in fabricating semiconductor-based structures, the processing composition comprising a liquid carrier and a compound of Formula I. It will be understood by one of skill in the art that the processing compositions of the present invention can include one or more compounds of Formula I.

DETAILED DESCRIPTION OF THE INVENTION

Figure 1:
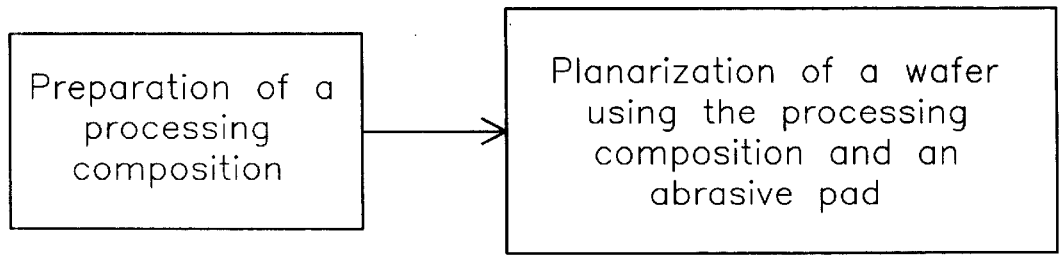
FIG. 1 illustrates a process flow for using a processing composition during the planarization of semiconductor-based substrates with an abrasive pad in accordance with the present invention.

The present invention is directed to compositions and methods for processing substrates and equipment, and in particular for cleaning substrates and processing equipment both during and subsequent to planarization, for example. This can include, for example, planarizing semiconductor-based substrate surfaces (i.e., surfaces of structures formed at least in part with a semiconductor material) or polishing glass substrates, using a liquid composition including a quantity of a β-diketonate-containing compound.

It is to be understood that the term "processing" as used herein is meant to encompass a wide variety of planarization techniques, cleaning techniques, conditioning techniques, and the like. This includes wet etching and wet conditioning techniques, wherein solutions are used to remove a desired portion of a semiconductor-based substrate surface, for example, or are used to "condition" a semiconductor-based substrate surface in preparation for a subsequent processing step. The liquid composition of this invention may also be used before or after such etching or conditioning treatments.

It is further to be understood that the term "planarization" as used herein is meant to encompass a wide variety of planarization techniques, as well known to one skilled in the art, whereby planarization is accomplished through mechanical abrasion of the substrate. Planarization can also encompass a chemically active component, such as in, for example, chemical mechanical planarization (CMP). Planarization and polishing processing are described generally herein as planarization, as both terms are meant to encompass mechanical abrasion of the substrate, even though polishing typically refers to less abrasion of the substrate than planarization.

It is also to be understood that the term "substrate" includes a wide variety of semiconductor-based structures and other substrates that can be contaminated by abrasive materials during processing. Substrate can be a single material, such as, for example, a silicon wafer. Substrate is also to be understood as including silicon-on-sapphire (SOS) technology, silicon-on-insulator (SOI) technology, doped and undoped semiconductors, epitaxial layers of silicon supported by a base semiconductor, as well as other semiconductor-based structures, including any number of layers as is well known to one skilled in the art. Furthermore, when reference is made to a substrate herein, previous process steps may have been utilized to form regions/junctions in a base semiconductor structure.

Processing (e.g., cleaning) compositions of the present invention can be used to reduce the amount of, for example, metal and metalloid ion and abrasive particulate contaminants left on the substrate and planarization processing equipment as a result of the planarization process. By using the compositions and methods of the present invention, substrates and processing equipment can be cleaned effectively, removing contaminants such as abrasive particulates (e.g., silicon or aluminum oxides) and metal or metalloid ions, atoms, or molecules. For example, in semiconductor-based device fabrication, such methods and compositions enable higher yields to be realized in the fabrication of semiconductor-based integrated circuits due to the reduction in wafer losses due to excessive residual particulate contamination, which often degrades electrical performance of an integrated circuit. Furthermore, by using processing compositions of this invention, processing equipment can be cleaned in-situ, minimizing down time in the fabrication of integrated circuits.

The target contaminants of which the present invention is beneficial in removing, include, particularly, aluminum (Al) and silicon (Si) ions, atoms, or molecules, particularly oxides, as these are typically used in abrasive particles. Other contaminants include, for example, ions, atoms, molecules, or compounds of: the alkali metals such as sodium (Na), potassium (K) and lithium (Li); alkaline earth metals such as magnesium (Mg) and calcium (Ca); and heavy metals such as iron (Fe), nickel (Ni), zinc (Zn), chromium (Cr), manganese (Mn), titanium (Ti), zirconium (Zr), and copper (Cu). The target abrasive particulates of which the present invention is particularly beneficial in removing include alumina, silica, and similar particulates.

The compositions of the present invention can function in a variety of ways. For example, the compositions can act by suspending or dissolving the contaminants through chelating or sequestering the contaminants. However, the purpose of compositions of the present invention is to remove contaminants from substrate and processing equipment surfaces whatever mechanism is involved. Therefore, the present invention is not limited to any particular mechanism.

The compositions include a β-diketonate containing compound (i.e., one or more compounds) of the following formula (Formula I):

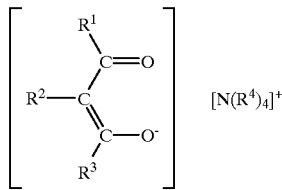

wherein each $R^1$, $R^2$, $R^3$, and $R^4$ is independently H or an organic group. Preferably, the organic groups contain 1–30 carbon atoms, and more preferably, 1–20 carbon atoms. Even more preferably, each $R^1$, $R^2$, $R^3$, and $R^4$ is independently H, or a hydrocarbyl group optionally containing one or more heteroatoms (e.g., oxygen or nitrogen), fluorine atoms, or functional groups (e.g., a carbonyl group, a hydroxycarbyl group, or an aminocarbyl group). That is, included within the scope of the compounds of Formula I are compounds wherein at least one of the $R^1$, $R^2$, $R^3$, and $R^4$ groups is a hydrocarbyl group and at least one carbon atom in the hydrocarbyl group is replaced with one of a carbonyl group, a hydroxycarbyl group, an oxygen atom, a nitrogen atom, or an aminocarbyl group. Also included within the scope of the compounds of Formula I are compounds wherein at least one of the $R^1$, $R^2$, $R^3$, and $R^4$ groups is a hydrocarbyl group and at least one hydrogen atom in the hydrocarbyl group is replaced with a fluorine atom.

Most preferably, the hydrocarbyl groups of Formula I are ($C_1$–$C_4$)hydrocarbyl groups, which may be a linear, branched, or cycloalkyl groups, as well as alkenyl groups (e.g., dienes and trienes), or alkynyl groups. In any of these hydrocarbon groups, one or more of the hydrogen atoms can be replaced by fluorine atoms. Of these, the hydrocarbyl groups are preferably methyl groups. In one preferred embodiment, at least one of the $R^1$, $R^2$, $R^3$, and $R^4$ groups is a methyl group. In another preferred embodiment, $R^2$ is H and $R^1$, $R^3$, and $R^4$ are methyl groups. It will be understood by one of skill in the art that each $R^4$ may be the same or different. Preferably, however, they are all the same. More preferably, they are all methyl groups.

As used herein, the term "organic group" means a hydrocarbon group that is classified as an aliphatic group, cyclic group, or combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or aryl group" means a mono- or polynuclear aromatic hydrocarbon group. The term "heterocyclic group" means a closed ring hydrocarbon in which one or more of 20 the atoms in the ring is an element other than carbon (e.g., nitrogen, oxygen, sulfur, etc.).

In compounds such as this, substitution is not only tolerated, but is often advisable. Thus, substitution is anticipated in the compounds used in the compositions of the present invention. As a means of simplifying the discussion and the recitation of certain terminology used throughout this application, the terms "group" and "moiety" are used to differentiate between chemical species that allow for substitution or that may be substituted and those that do not so allow or may not be so substituted. Thus, when the term "group" is used to describe a chemical substituent, the described chemical material includes the unsubstituted group and that group with nonperoxidic O, N, Si, or S atoms, for example, in the chain as well as carbonyl groups, carboxyl groups, or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

The compounds of Formula I are typically prepared by reaction of tetraorganoammonium hydroxide (e.g., tetramethylammonium hydroxide) with a diketone in an aqueous medium. They are then mixed with a suitable liquid carrier, such as water, an organic solvent, or a previously prepared cleaning solution or planarization slurry, for example, to form the processing (e.g., cleaning) compositions of the present invention. Compositions of the present invention are typically aqueous-based, although other solvents, such as, for example, organic solvents, can be used in place of, or in addition to, water. The compounds of Formula I may be used alone or in combination with other compounds of Formula I or with other components used in standard cleaning solutions (e.g., $H_2O_2$) or standard planarization slurries. For example, other compositions in which the Formula I compounds can be mixed include commercial cleaning solutions, such as an SC-1 wet cleaning solution.

The compositions of the present invention can also have other additives and surfactants added, examples of which are well known to one skilled in the art. For example, in addition to the P-diketonate-containing compound of Formula I, the compositions of the present invention can also include $NH_4OH$ and $H_2O_2$ when used in a SC-1 cleaning solution. The compositions of the present invention can also include an abrasive component (e.g., silica and/or alumina particulates) when used in planarization slurries.

The amount of compound of Formula I used in the processing (e.g., cleaning) compositions of the present invention is an amount effective to reduce the concentration of, for example, metal and metalloid ions or other contaminants in liquid compositions and surfaces with which the liquid compositions are in contact. Concentrations of compounds of this invention can be up to about nearly 100% of the compositions in which they are used. Preferably, the compound of Formula I is present in the composition in an amount of less than about 50% by weight. More preferably, the compound of Formula I is present in the composition in an amount of less than about 10% by weight.

The compounds of Formula I can be utilized in an immersion bath or by spraying surfaces to be cleaned, for example, with compositions of the present invention. The compounds of Formula I form very stable chelates with a wide variety of metals. Thus, better particulate and metallic contaminant removal is possible when using compositions of the present invention. Such compositions may also be more efficiently rinsed from surfaces by using water or organic solvents, such as IPA (isopropyl alcohol) or NMP (N-methyl pyrrolidone).

Figure 2:
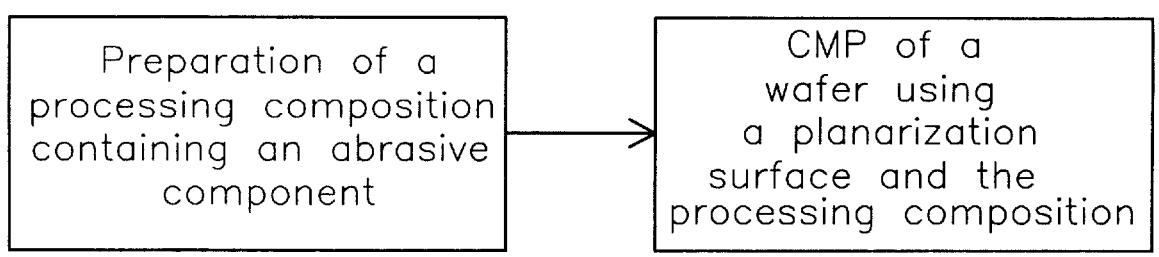
FIG. 2 illustrates a process flow for using an abrasive processing composition during the planarization of semiconductor-based substrates in accordance with the present invention.

As illustrated in FIGS. 1 and 2, the liquid compositions of this invention can be used in contact with, for example, planarization surfaces (i.e., abrasive pads, polishing pads, polishing surfaces, etc.), substrates, and other similar surfaces during processing, such as planarization. When using processing compositions of the invention for cleaning planarization processing equipment, planarization equipment can be cleaned during planarization processing. The compositions of the present invention can be used in a wide variety of planarization equipment. For example, they can be used in a Westech Model 372M wafer polisher, a Strasbaugh 6DS, or an ISOPLANAR 8000 by Cybeq Systems. When used during planarization, the processing compositions do not need to contain an abrasive component when an abrasive planarization surface, for example, an abrasive pad, is used during planarization, as described in FIG. 1.

However, as illustrated in FIG. 2, the processing composition can include an abrasive component, particularly when an abrasive planarization structure is not utilized during planarization. Even when an abrasive planarization structure is utilized during planarization, abrasive particulates may break free of the planarization surface and become solvated in the processing composition. Thus, even when processing compositions are initially free of abrasive particulates, they may become abrasive processing compositions due to this mechanism.

Figure 3:
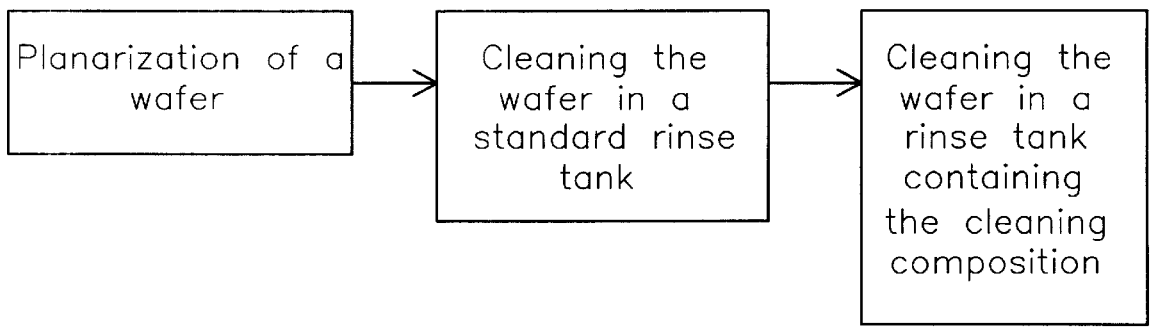
FIG. 3 illustrates a process flow for using a cleaning composition to clean semiconductor-based substrates subsequent to planarization in accordance with the present invention.

The compositions of the present invention can also be used as cleaning compositions in a wide variety of cleaning processes. For example, they can be used in ultrasonic or brush-cleaning systems. As illustrated in FIG. 3, the compositions of the present invention are useful for removing, for example, post-planarization contamination from substrate surfaces. Compositions of the present invention can be used on substrates having junctions, isolation areas, steps, polysilicon lines, dielectrics, oxide-filled trenches, various metal films, doped oxides, spin on glasses, borophosphosilicate glass (BPSG), or any other such surface which may require processing, for example, planarization and subsequent cleaning as is known to one skilled in the art.

Figure 4:
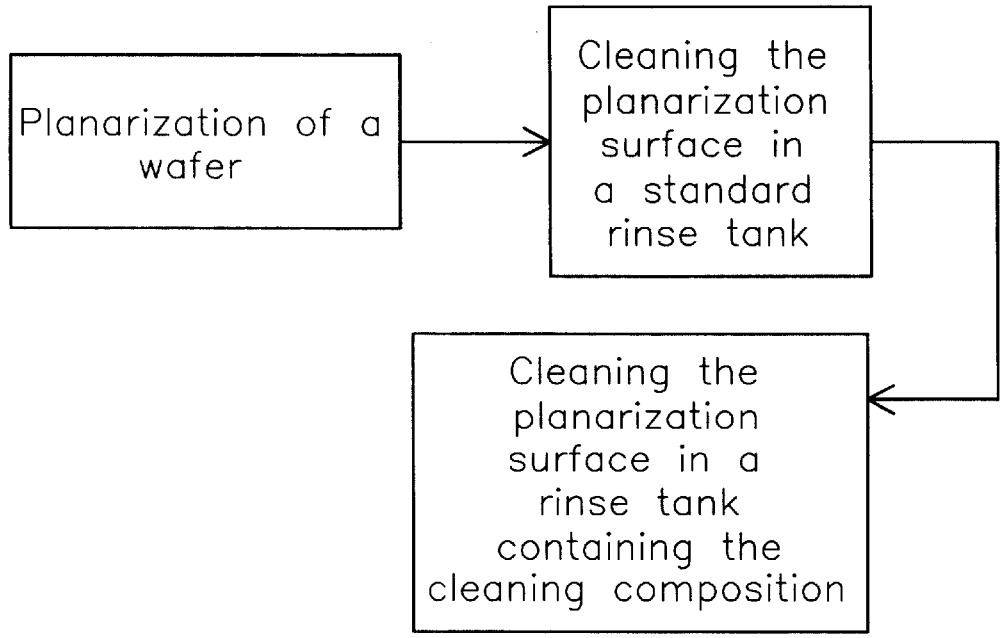
FIG. 4 illustrates a process flow for using the cleaning composition to clean planarization processing equipment in accordance with the present invention.

As illustrated in FIG. 4, the compositions of the present invention can also be used as cleaning compositions to clean planarization equipment after planarization processing. For example, polishing surfaces, abrasive pads, or any other such planarization surface that contacts an abrasive slurry or non-abrasive chemical component during planarization can be cleaned with the compositions of the present invention.

The present invention is not limited to use with nonplanar surfaces. The present invention is also beneficial for use with substantially planar surfaces. Therefore, the present invention is not limited to the planarization or cleaning of any particular surface, but is limited only in accordance with the invention as described in the accompanying claims.

The following examples are offered to further illustrate the various specific and preferred embodiments and techniques. It should be understood, however, hat many variations and modifications may be made while remaining within the scope f the present invention.

EXAMPLES

Example 1

Preparation of Tetraalkylammonium 2,4-Pentanedionate 2,4-Pentanedione (143 mL, commercially available from Aldrich Chemical Co. of Milwaukee, Wis.) is mixed into 1 L of tetramethyl ammonium hydroxide (commercially available from Moses Lake Industries of Moses Lake, Wash.). The resulting colorless solution is then suitable for use in a cleaning vessel as prepared or it may be further diluted with deionized water.

Example 2

Use of Tetramethyllammonium 2,4-Pentanedionate in a Post-Planarization

Cleaning Composition

A cleaning tank (commercially available from SubMicron Systems of Allentown, Pa.) is charged with a mixture of deionized water, tetramethylammonium 2,4-pentanedionate (as prepared according to Example 1), and hydrogen peroxide (30% solution, commercially available from Olin Microelectronics Materials of Norwalk, Conn.) in a 30:1:5 volume ratio. Silicon wafers were cycled in the cleaning tank for 90 seconds, followed by a deioinzed water rinse for 160 seconds, and then dried.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. For example, while the description above focused on planarization of semiconductor-based substrates, the compositions and methods of the invention are also applicable to, for example, polishing glasses and contact lenses, as one of many other possible applications. The complete disclosures of all patents, patent documents, and publications listed herein are incorporated by reference, as if each were individually incorporated by reference.

What is claimed is:

1. A processing composition for use in fabricating semiconductor-based structures, the processing composition comprising a liquid carrier and a compound of the formula:

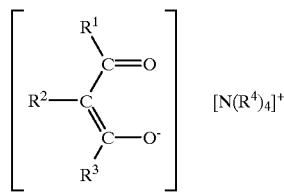

wherein each $R^1$, $R^2$, $R^3$, and $R^4$ is independently H or an organic group and wherein the liquid carrier comprises water.

2. The composition according to claim 1, wherein each of $R^1$, $R^2$, $R^3$, and $R^4$ is independently H or a hydrocarbyl group.

3. The composition according to claim 2, wherein the hydrocarbyl group is $C_1$–$C_4$ hydrocarbyl group.

4. The composition according to claim 2, wherein one or more hydrogen atoms in the hydrocarbyl group are replaced by fluorine atoms.

5. The composition according to claim 1, wherein the compound of Formula I is present in the composition in an amount of less than about 50% by weight.

6. The composition according to claim 5, wherein the compound of Formula I is present in the composition in an amount of less than about 10% by weight.

7. The composition according to claim 1, wherein the composition further comprises a surfactant.

8. A processing composition for use in fabricating semiconductor-based structures, the processing composition comprising a liquid carrier and a compound of the formula:

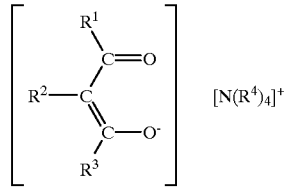

wherein each $R^1$, $R^2$, and $R^3$ is independently H or an organic group, wherein the composition further comprises an abrasive component.

9. The composition according to claim 8, wherein each of $R^1$, $R^2$, $R^3$, and $R^4$ is independently H or a hydrocarbyl group.

10. The composition according to claim 9, wherein the compound of Formula I is present in the composition in an amount of less than about 10% by weight.

11. The composition according to claim 9, wherein the hydrocarbyl group is $C_1$–$C_4$ hydrocarbyl group.

12. The composition according to claim 9, wherein one or more hydrogen atoms in the hydrocarbyl group are replaced by fluorine atoms.

13. The composition according to claim 8, wherein the compound of Formula I is present in the composition in an amount of less than about 50% by weight.

14. The composition according to claim 13, wherein the compound of Formula I is present in the composition in an amount of less than about 10% by weight.

15. A processing composition for use in fabricating semiconductor-based structures, the processing composition comprising a liquid carrier and a compound of the formula:

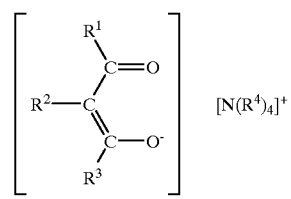

wherein each $R^1$, $R^2$, $R^3$, and $R^4$ is independently H or an organic group and wherein the liquid carrier consists essentially of water.

16. The composition according to claim 15, wherein each of $R^1$, $R^2$, $R^3$, and $R^4$ is independently H or a hydrocarbyl group.

17. The composition according to claim 16, wherein the hydrocarbyl group is $C_1$–$C_4$ hydrocarbyl group.

18. The composition according to claim 16, wherein one or more hydrogen atoms in the hydrocarbyl group are replaced by fluorine atoms.

19. The composition according to claim 15, wherein the compound of Formula I is present in the composition in an amount of less than about 50% by weight.

20. The composition according to claim 15, wherein the composition further comprises an abrasive component.

* * * * *

UNITED STATES PATENT AND TRADEMARK OFFICE
CERTIFICATE OF CORRECTION

PATENT NO. : 6,207,630 B1
DATED : March 27, 2001
INVENTOR(S) : Brian A. Vaartstra It is certified that error appears in the above-identified patent and that said Letters Patent is hereby corrected as shown below:

Column 6,
Line 30, delete "20".
Line 63, insert -- β- -- before "diketone".

Column 7,
Line 14, delete "P-diketonate" and insert -- β-diketonate -- therefor.

Column 8,
Line 29, delete "hat" and insert -- that -- therefor.
Line 31, delete "f" and insert -- of -- therefor.

Column 9, claim 8,
Line 54, delete "and" and insert -- , and $R^4$ -- after "$R^3$".

Signed and Sealed this

Twenty-seventh Day of November, 2001

Attest:

*Nicholas P. Godici*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO. : 6,207,630 B1
DATED : March 27, 2001
INVENTOR(S) : Brian A. Vaartstra Page 1 of 1

It is certified that error appears in the above-identified patent and that said Letters Patent is hereby corrected as shown below:

Column 6,
Line 30, delete "20".
Line 63, insert -- β- -- before "diketone".

Column 7,
Line 14, delete "P-diketonate" and insert -- β-diketonate -- therefor.

Column 8,
Line 29, delete "hat" and insert -- that -- therefor.
Line 31, delete "f" and insert -- of -- therefor.

Column 9, claim 8,
Line 54, delete "and" and insert -- , and $R^4$ -- after "$R^3$".

Signed and Sealed this

Eighteenth Day of December, 2001

Attest:

*Attesting Officer*

JAMES E. ROGAN
*Director of the United States Patent and Trademark Office*